(12) United States Patent
Isono (10) Patent No.: US 11,439,006 B2
(45) Date of Patent: Sep. 6, 2022

(54) FLEXIBLE BOARD, METHOD FOR MANUFACTURING THE SAME, AND ELECTRONIC DEVICE

(71) Applicant: Murata Manufacturing Co., Ltd., Nagaokakyo (JP)

(72) Inventor: Fumiya Isono, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/120,517

(22) Filed: Dec. 14, 2020

(65) Prior Publication Data

US 2021/0100094 A1 Apr. 1, 2021

Related U.S. Application Data

(63) Continuation of application No. PCT/JP2019/025853, filed on Jun. 28, 2019.

(30) Foreign Application Priority Data

Jul. 2, 2018 (JP) .............................. JP2018-126119

(51) Int. Cl.
*H05K 1/02* (2006.01)
*H05K 1/11* (2006.01)
(Continued)

(52) U.S. Cl.
CPC ........... *H05K 1/0296* (2013.01); *H05K 1/028* (2013.01); *H05K 1/032* (2013.01); *H05K 1/0393* (2013.01);
(Continued)

(58) Field of Classification Search
CPC ...... H05K 1/0296; H05K 1/028; H05K 1/032; H05K 1/0393; H05K 3/103; H05K 3/28; H05K 3/281; H01B 5/14
See application file for complete search history.

(56) References Cited

U.S. PATENT DOCUMENTS 4,715,928 A * 12/1987 Hamby ................ H05K 3/4691
156/150
6,171,114 B1 * 1/2001 Gillette .................. H01R 12/82
439/67
(Continued)

FOREIGN PATENT DOCUMENTS

| JP | 2005-340382 A | 12/2005 |
| WO | 2013/069763 A1 | 5/2013 |
| WO | 2018/037871 A1 | 3/2018 |

OTHER PUBLICATIONS

Official Communication issued in International Patent Application No. PCT/JP2019/025853, dated Sep. 17, 2019.

*Primary Examiner* — Ishwarbhai B Patel
(74) *Attorney, Agent, or Firm* — Keating & Bennett, LLP (57) ABSTRACT

A flexible board includes a flexible resin base material, a conductor pattern on a principal surface of the resin base material and including first and second electrodes electrically separated from each other, a first protective film having lower flexibility than the resin base material and covering a portion of the conductor pattern, and a second protective film having higher flexibility than the first protective film and extending over the principal surface of the resin base material and the first protective film to cover another portion of the conductor pattern. The first protective film is closer to the first and second electrodes on the principal surface of the resin base material than the second protective film. The first protective film includes a first opening exposing a portion of the first electrode and a second opening exposing a portion of the second electrode in planar view.

13 Claims, 8 Drawing Sheets

(51) Int. Cl.
*H05K 1/03* (2006.01)
*H05K 3/10* (2006.01)
*H05K 3/28* (2006.01)
*H05K 1/18* (2006.01)

(52) U.S. Cl.
CPC ............ *H05K 1/111* (2013.01); *H05K 3/103* (2013.01); *H05K 3/28* (2013.01); *H05K 1/0216* (2013.01); *H05K 1/0298* (2013.01); *H05K 1/0313* (2013.01); *H05K 1/118* (2013.01); *H05K 1/18* (2013.01)

(56) References Cited

U.S. PATENT DOCUMENTS

| | | | |
|---|---|---|---|
| 9,462,678 B2 * | 10/2016 | Wakabayashi | H01P 3/081 |
| 9,713,251 B2 * | 7/2017 | Kato | H05K 1/0286 |
| 2014/0176264 A1 | 6/2014 | Tago et al. | |
| 2019/0173208 A1 | 6/2019 | Sasaki et al. | |

* cited by examiner

FLEXIBLE BOARD, METHOD FOR MANUFACTURING THE SAME, AND ELECTRONIC DEVICE

CROSS REFERENCE TO RELATED APPLICATIONS

This application claims the benefit of priority to Japanese Patent Application No. 2018-126119 filed on Jul. 2, 2018 and is a Continuation Application of PCT Application No. PCT/JP2019/025853 filed on Jun. 28, 2019. The entire contents of each application are hereby incorporated herein by reference.

BACKGROUND OF THE INVENTION

1. Field of the Invention

The present invention relates to a flexible board, a method for manufacturing the same, and an electronic device including the flexible board.

2. Description of the Related Art

Substrates having various structures are conventionally known as flexible boards. For example, JP 2005-340382 A describes a flexible board including a coverlay film as a protective film for protecting a conductor pattern disposed on one principal surface of a resin base material.

The coverlay film is a film affixed to one principal surface of a resin base material via an adhesive and having elasticity that may withstand repeated bending. JP 2005-340382 A describes that an adhesion improving treatment layer is disposed on a surface of a conductor pattern coming into contact with a coverlay film so as to improve a bending performance of a flexible board. JP 2005-340382 A also describes that the surface of the conductor pattern is subjected to a roughing treatment or an oxidation treatment for the adhesion improving treatment.

A coverlay film has a problem of low patterning accuracy for more accurately exposing a desired conductor pattern serving as an input/output electrode or an electrode pad when the coverlay film is affixed to one principal surface of a resin base material. Particularly, when a flexible board is used for communicating high-frequency signals in the HF band or UHF band, even a slight displacement of the coverlay film leads to deterioration of high-frequency characteristics. Additionally, performing the roughening treatment or the oxidizing treatment of a surface of a conductor pattern for the adhesion improving treatment as in JP 2005-340382 A also leads to deterioration of the high frequency characteristics.

In this regard, it is conceivable that a resist is applied onto one principal surface of the resin base material to form a protective film by patterning the resist by a photolithography method. According to this method, the protective film is hardly displaced, and deterioration of high frequency characteristics can be suppressed.

However, the protective film formed by the photolithography method has a problem that the film is harder and more fragile than the coverlay film and has low elasticity. Therefore, if the flexible board including the protective film is repeatedly bent or is bent in a large angle, the protective film may be unable to follow the bending and may be peeled off from the conductor pattern or damaged. Therefore, the flexible board has a problem of low bending performance.

SUMMARY OF THE INVENTION

Preferred embodiments of the present invention provide flexible boards that are each capable of improving patterning accuracy and reducing or preventing a decrease in bending performance, methods for manufacturing the same, and electronic devices each including a flexible board.

A flexible board according to a preferred embodiment of the present invention includes a resin base material having flexibility; a conductor pattern on one principal surface of the resin base material and including a first electrode and a second electrode electrically separated from each other; a first protective film having lower flexibility than the resin base material and covering a portion of the conductor pattern; and a second protective film having higher flexibility than the first protective film and extending over the one principal surface of the resin base material and the first protective film to cover another portion of the conductor pattern, wherein the first protective film is closer to the first electrode and the second electrode on the one principal surface of the resin base material than the second protective film, and the first protective film includes a first opening exposing at least a portion of the first electrode and a second opening exposing at least a portion of the second electrode in planar view.

An electronic device according to a preferred embodiment of the present invention includes at least one circuit board and a flexible board connected to the circuit board, wherein the flexible board includes a resin base material having flexibility; a conductor pattern on one principal surface of the resin base material and including a first electrode and a second electrode electrically separated from each other; a first protective film having lower flexibility than the resin base material and covering a portion of the conductor pattern; and a second protective film having higher flexibility than the first protective film and extending over the one principal surface of the resin base material and the first protective film to cover another portion of the conductor pattern, wherein the first protective film is closer to the first electrode and the second electrode on the one principal surface of the resin base material than the second protective film, and the first protective film includes a first opening exposing at least a portion of the first electrode and a second opening exposing at least a portion of the second electrode in planar view.

A method for manufacturing a flexible board according to a preferred embodiment of the present invention includes preparing a flexible resin base material having one principal surface provided with a conductor pattern including a first electrode and a second electrode electrically separated from each other; covering a portion of the conductor pattern with a first protective film having lower flexibility than the resin base material; and disposing a second protective film having higher flexibility than the first protective film such that the second protective film extends over the one principal surface of the resin base material and the first protective film to cover another portion of the conductor pattern, wherein the first protective film is closer to the first electrode and the second electrode on the one principal surface of the resin base material than the second protective film.

According to preferred embodiments of the present invention, the patterning accuracy is able to be improved, and the deterioration of the bending performance is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A flexible board according to a preferred embodiment of the present invention includes a resin base material having flexibility; a conductor pattern disposed on one principal surface of the resin base material and including a first electrode and a second electrode electrically separated from each other; a first protective film having lower flexibility than the resin base material and covering a portion of the conductor pattern; and a second protective film having higher flexibility than the first protective film and extending over the one principal surface of the resin base material and the first protective film to cover another portion of the conductor pattern, wherein the first protective film is closer to the first electrode and the second electrode on the one principal surface of the resin base material than the second protective film, and the first protective film includes a first opening exposing at least a portion of the first electrode and a second opening exposing at least a portion of the second electrode in planar view.

According to this configuration, the first protective film having lower flexibility than the resin base material is provided in the vicinity of the first electrode and the second electrode having a significant influence on patterning accuracy, and the second protective film having higher flexibility than the first protective film is provided in a portion having a significant influence on bending performance. As a result, the patterning accuracy can be improved, and a deterioration of the bending performance can be reduced or prevented. Since the second protective film extends over the one principal surface of the resin base material and the first protective film, the conductor pattern can be prevented from being unintentionally exposed from a gap between the first protective film and the second protective film.

A thickness of the second protective film may be thinner than a thickness of the first protective film. According to this configuration, the flexibility of the second protective film becomes higher and the flexibility of the first protective film becomes lower, so that the patterning accuracy can be further improved and the deterioration of the bending performance can be further reduced or prevented.

For example, a level difference is provided between the first protective film and the one principal surface of the resin base material, and the level difference may cause a void in a region adjacent to an outer circumferential end portion of the first protective film and between the second protective film and the one principal surface of the resin base material. If a plating solution, for example, to prevent corrosion of the first electrode enters the void and hardens, the conductor pattern may be short-circuited.

Therefore, conductor patterns in contact with a region adjacent to an outer circumferential end portion of the first protective film and between the second protective film and the one principal surface of the resin base material may be electrically connected to each other. According to this configuration, the conductor patterns in contact with the region have the same potential when connected to the circuit board, so that even when the conductor pattern in contact with the region is short-circuited, electrical characteristics can be prevented from changing.

The conductor pattern in contact with the region may be physically continuous. According to this configuration, the conductor pattern in contact with the region more reliably has same potential when connected to the circuit board, and the electrical characteristics can more reliably be prevented from changing.

The region adjacent to the outer circumferential end part of the first protective film and between the second protective film and the one principal surface of the resin base material may be a closed space so as not to be exposed to outside. According to this configuration, the plating solution can be prevented from entering the region.

The flexible board may be bent in a portion provided with the second protective film. Since the second protective film has higher flexibility than the first protective film, the second protective film can follow the bending, and the deterioration of the bending performance can be reduced or prevented.

The first electrode may be coated with a material having higher oxidation resistance than the first electrode. With the configuration described above, the conductor pattern can be prevented from being short-circuited even if the plating solution, for example, enters the region and hardens, and therefore, the electrical characteristics can be prevented from changing even when the first electrode is coated with a material having high oxidation resistance.

The second protective film may include an opening enclosing the first opening and the second opening of the first protective film in planar view. According to this configuration, the first electrode and the second electrode are exposed depending only on the first opening and the second opening of the first protective film, so that the patterning accuracy can be further improved.

An electronic device according to an a preferred embodiment of the present invention includes at least one circuit board and a flexible board connected to the circuit board, wherein the flexible board includes a resin base material having flexibility; a conductor pattern disposed on one principal surface of the resin base material and including a first electrode and a second electrode electrically separated from each other; a first protective film having lower flexibility than the resin base material and covering a portion of the conductor pattern; and a second protective film having higher flexibility than the first protective film and extending over the one principal surface of the resin base material and the first protective film to cover another portion of the conductor pattern, wherein the first protective film is closer to the first electrode and the second electrode on the one principal surface of the resin base material than the second protective film, and the first protective film includes a first opening exposing at least a portion of the first electrode and a second opening exposing at least a portion of the second electrode in planar view.

According to this configuration, the first protective film having lower flexibility than the resin base material is provided in the vicinity of the first electrode and the second electrode having a significant influence on patterning accuracy, and the second protective film having higher flexibility than the first protective film is provided in a portion having a significant influence on bending performance. As a result, the patterning accuracy can be improved, and a deterioration of the bending performance can be reduced or prevented. Since the second protective film extends over the one principal surface of the resin base material and the first protective film, the conductor pattern can be prevented from being unintentionally exposed from a gap between the first protective film and the second protective film.

A thickness of the second protective film may be thinner than a thickness of the first protective film. According to this configuration, the flexibility of the second protective film becomes higher and the flexibility of the first protective film becomes lower, so that the patterning accuracy can be further improved and the deterioration of the bending performance can be further reduced or prevented.

The conductor pattern in contact with a region adjacent to an outer circumferential end portion of the first protective film and between the second protective film and the one principal surface of the resin base material may have same potential when connected to the circuit board. According to this configuration, even if the conductor pattern is short-circuited, the electrical characteristics can be prevented from changing.

The conductor pattern in contact with the region may define and function as a ground electrode. According to this configuration, even if the conductor pattern is short-circuited, the electrical characteristics can be prevented from changing.

Further, the flexible board may be connected to the circuit board in a state of being bent in a portion provided with the second protective film. Since the second protective film has higher flexibility than the first protective film, the second protective film can follow the bending, and the deterioration of the bending performance can be reduced or prevented.

A method for manufacturing a flexible board according to a preferred embodiment of the present invention includes preparing a flexible resin base material having one principal surface provided with a conductor pattern including a first electrode and a second electrode electrically separated from each other; covering a portion of the conductor pattern with a first protective film having lower flexibility than the resin base material; and disposing a second protective film having higher flexibility than the first protective film such that the second protective film extends over the one principal surface of the resin base material and the first protective film to cover another portion of the conductor pattern, wherein the first protective film is closer to the first electrode and the second electrode on the one principal surface of the resin base material than the second protective film.

According to this method, the first protective film having lower flexibility than the resin base material is provided in the vicinity of the first electrode and the second electrode having a significant influence on patterning accuracy, and the second protective film having higher flexibility than the first protective film is provided in a portion having a significant influence on bending performance. As a result, the patterning accuracy can be improved, and a deterioration of the bending performance can be reduced or prevented. Since the second protective film extends over the one principal surface of the resin base material and the first protective film, the conductor pattern can be prevented from being unintentionally exposed from a gap between the first protective film and the second protective film.

A thickness of the second protective film may be thinner than a thickness of the first protective film. According to this method, the flexibility of the second protective film becomes higher and the flexibility of the first protective film becomes lower, so that the patterning accuracy can be further improved and the deterioration of the bending performance can be further reduced or prevented.

The first protective film is formed by applying a resist in the vicinity of the first electrode and the second electrode on the one principal surface of the resin base material and patterning the resist by a photolithography method. According to this method, the patterning accuracy can be further improved.

Further, the second protective film may be a coverlay film including an adhesive layer bonded to extend over the one principal surface of the resin base material and the first protective film. According to this method, the deterioration of the bending performance can be further reduced or prevented.

The method may further include a step of supplying a plating solution including a material having higher oxidation resistance than the first electrode to at least portions of the first electrode and the second electrode through an opening disposed in the first protective film, and conductor patterns in contact with a region adjacent to an outer circumferential end portion of the first protective film and between the second protective film and the one principal surface of the resin base material may electrically be connected to each other. According to this method, the conductor pattern can be prevented from being short-circuited even if the plating solution, for example, enters the region and hardens, and therefore, the electrical characteristics can be prevented from changing even when the first electrode is coated with a material having high oxidation resistance.

Preferred embodiments of the present invention will hereinafter be described with reference to the drawings. In the drawings, corresponding elements and members having the same or similar functions are denoted by the same reference numerals. Although the preferred embodiments are separately described for convenience in consideration of facilitating explanation or understanding of main points, configurations described in different preferred embodiments can partially be replaced or combined. In second and subsequent preferred embodiments, matters in common with the first preferred embodiment will not be described, and only the differences will be described. Particularly, the same or similar advantageous effects according to the same or similar configurations will not be described in each preferred embodiment.

First Preferred Embodiment

Figure 1:
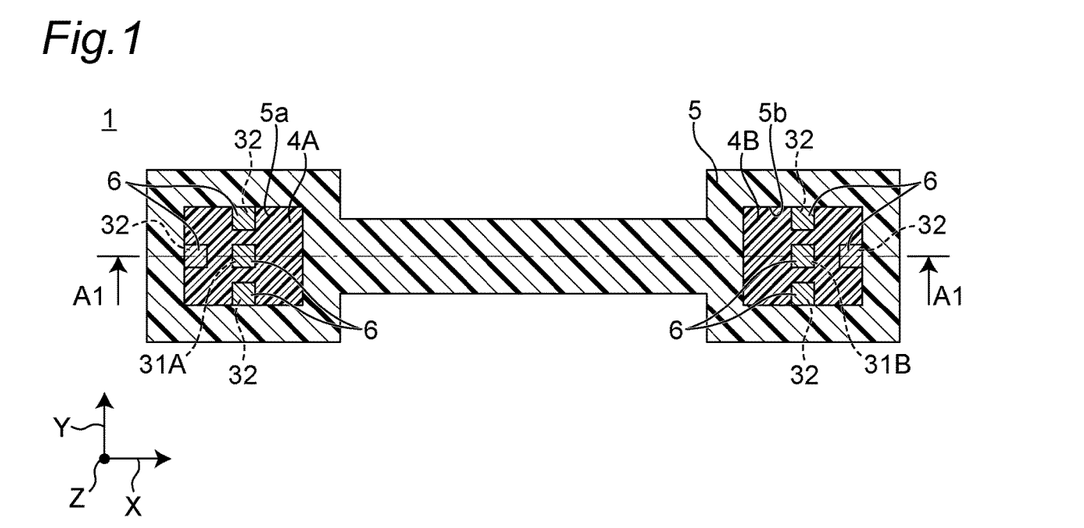
FIG. 1 is a plan view showing a schematic configuration of a flexible board according to a first preferred embodiment of the present invention.
Figure 2:
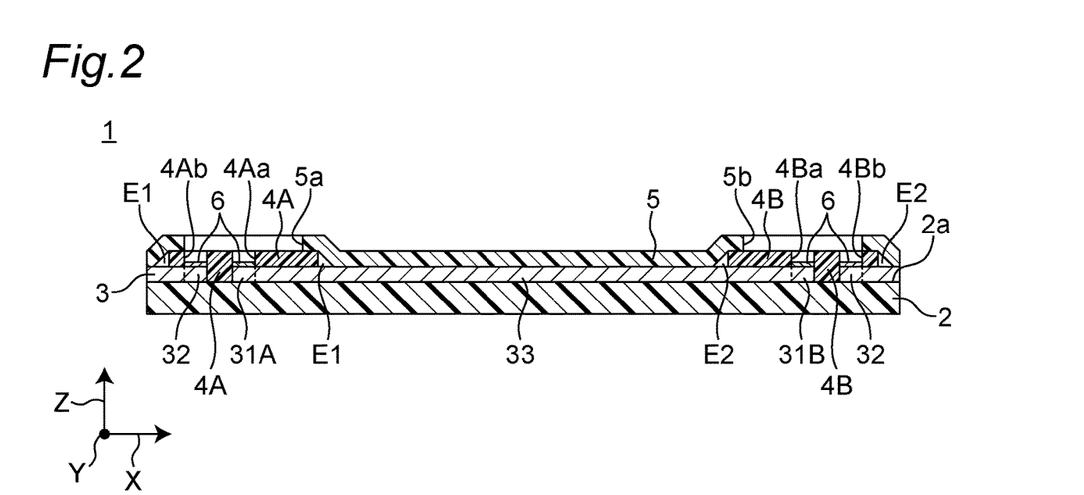
FIG. 2 is a cross-sectional view taken along a line A1-A1 of FIG. 1.
Figure 3A:
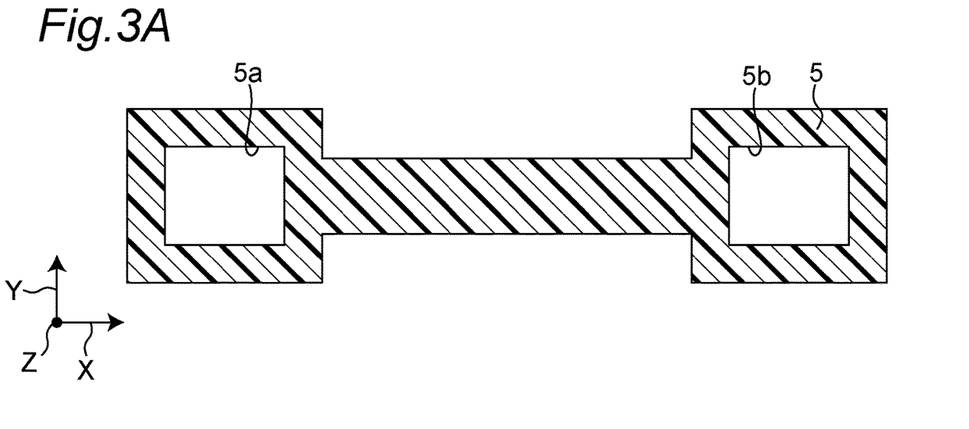
FIG. 3A is an exploded plan view of the flexible board of FIG. 1, showing a second protective film.
Figure 3B:
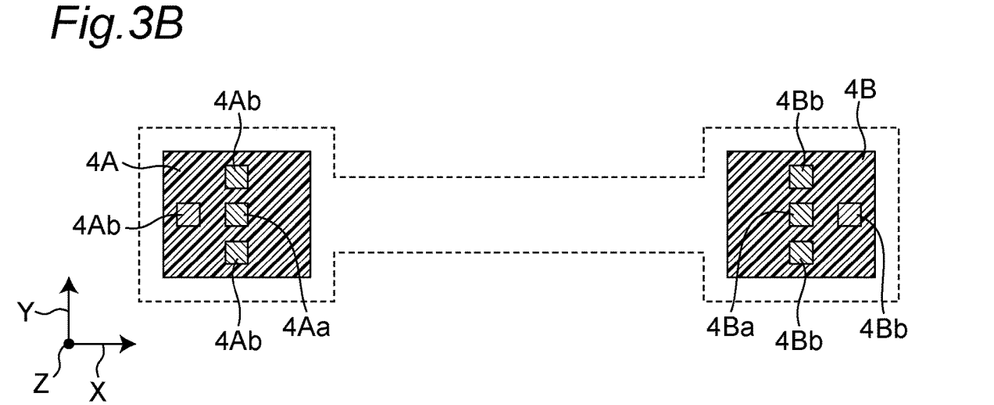
FIG. 3B is an exploded plan view of the flexible board of FIG. 1, showing first protective films.
Figure 3C:
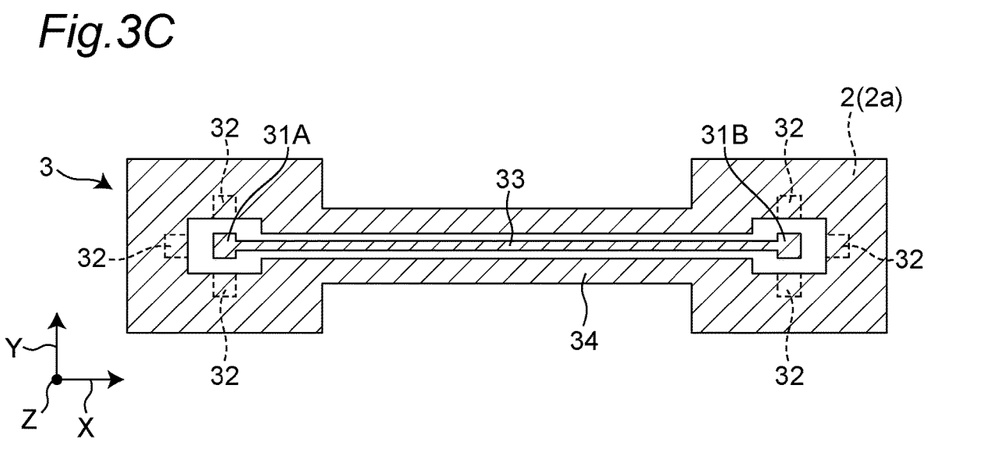
FIG. 3C is an exploded plan view of the flexible board of FIG. 1, showing a resin base material provided with a conductor pattern on one principal surface.

FIG. 1 is a plan view showing a schematic configuration of a flexible board according to a first preferred embodiment of the present invention. FIG. 2 is cross-sectional view taken along a line A1-A1 of FIG. 1. FIGS. 3A to 3C are exploded plan views of the flexible board of FIG. 1.

A flexible board 1 according to the first preferred embodiment is preferably a substrate used to communicate high frequency signals in the HF band and the UHF band, for example. More specifically, the flexible board 1 is used as a flat cable connecting two circuit boards including high frequency circuits in an electronic device, such as a mobile phone, for example.

As shown in FIG. 1, 2, or 3A to 3C, the flexible board 1 includes a resin base material 2 having flexibility, a conductor pattern 3 disposed on one principal surface 2a of the resin base material 2, and first protective films 4A, 4B and a second protective film 5 covering the conductor pattern 3. A longitudinal direction, a lateral direction (width direction), and a thickness direction (lamination direction) of the flexible board 1 will hereinafter be referred to as an X direction, a Y direction, and a Z direction, respectively.

The resin base material 2 is a plate-shaped dielectric element body extending in the X direction in planar view in the Z direction. In the first preferred embodiment, the resin base material 2 is preferably made of, for example, a flexible thermoplastic resin such as a liquid crystal polymer (LCP). The thickness of the resin base material 2 is preferably about 25 μm, for example. Both end portions of the resin base material 2 in the X direction are connecting portions connected to a circuit board included in an electronic device, and the width in the Y direction is expanded. As shown in FIG. 3C, a conductor pattern 3 is disposed on the one principal surface 2a of the resin base material 2.

The conductor pattern 3 is preferably made of a metal material such as copper foil, for example. The thickness of the conductor pattern 3 is preferably about 12 μm, for example. The conductor pattern 3 includes first electrodes 31A, 31B and second electrodes 32 electrically separated from each other. In the first preferred embodiment, the first electrode 31A is disposed at one end portion of the resin base material 2 in the X direction. The first electrode 31B is disposed at the other end portion of the resin base material 2 in the X direction. The first electrodes 31A, 31B define and function as input/output electrodes when the flexible board 1 is connected to the circuit board. The first electrodes 31A, 31B has a rectangular or substantially rectangular shape, for example. The first electrode 31A and the first electrode 31B are connected by a signal line 33.

The signal line 33 is a linear conductor capable of transmitting high frequency signals input/output through the first electrodes 31A, 31B. In the first preferred embodiment, the signal line 33 is a linear conductor extending in the X direction. The width of the signal line 33 in the Y direction is narrower than the width of the first electrodes 31A, 31B in the Y direction. The signal line 33 connects the center of the first electrode 31A in the Y direction and the center of the first electrode 31B in the Y direction.

As shown in FIG. 3C, the conductor pattern 3 includes a ground conductor 34 surrounding the first electrodes 31A, 31B and the signal line 33 at an interval. The outer shape of the ground conductor 34 is the same or substantially the same as the outer shape of the resin base material 2. In the first preferred embodiment, three second electrodes 32 are provided as portions of the ground conductor 34. The second electrodes 32 define and function as electrode pads when the flexible board 1 is connected to the circuit board. The second electrodes 32 define and function as ground electrodes when connected to the circuit board. As shown in FIG. 3B, the first protective films 4A, 4B are disposed in the vicinity of the first electrodes 31A, 31B and the three second electrodes 32. FIG. 3B illustrates that an outer circumferential portion of the first protective film 4A includes an opening along an outer circumferential portion of the first electrode 31A. It is also illustrated that an outer circumferential portion of the first protective film 4B includes an opening along an outer circumferential portion of the first electrode 31B.

The first protective film 4A covers a portion of the conductor pattern 3 on one end portion side of the resin base material 2 in the X direction. The first protective film 4A includes a first opening 4Aa exposing at least a portion of the first electrode 31A and second openings 4Ab exposing at least portions of the second electrodes 32 in planar view in the Z direction. The first opening 4Aa and the second openings 4Ab are preferably about 500-μm-square openings, for example. In the first preferred embodiment, the three second openings 4Ab are disposed around the first opening 4Aa at intervals.

The first protective film 4B covers a portion of the conductor pattern 3 on the other end portion side of the resin base material 2 in the X direction. The first protective film 4B is provided with a first opening 4Ba exposing at least a portion of the first electrode 31B and second openings exposing at least portions of the second electrodes 32 in planar view in the Z direction. 4Bb and 4Bb are provided. The first opening 4Ba and the second opening 4Bb are preferably about 500-μm-square openings, for example. In the first preferred embodiment, the three second openings 4Bb are disposed around the first opening 4Ba at intervals.

The first protective films 4A, 4B have lower flexibility than the resin base material 2. The first protective films 4A, 4B refer to any of protective films having a higher tensile strength than the resin base material 2, protective films having a higher maximum load point than the resin base material 2, and protective films having a higher Young's modulus than the resin base material 2. The first protective films 4A, 4B are preferably made of an epoxy resin, for example. The thickness of the first protective films 4A, 4B is preferably about 20 μm, for example. The first protective film 4A reduces or prevents deformation of a portion of the resin base material 2 on the one end portion side in the X direction provided with the first electrode 31A and the three second electrodes 32 and improves rigidity. The first protective film 4B reduces or prevents deformation of a portion of the resin base material 2 on the other end portion side in the X direction provided with the first electrode 31B and the second electrodes 32 and improves rigidity.

For example, the first protective film 4A is formed by applying a resist in the vicinity of the first electrode 31A and the second electrodes 32 on the one principal surface 2a of the resin base material 2 and patterning the resist by a photolithography method. Similarly, for example, the first protective film 4B is formed by applying a resist in the vicinity of the first electrode 31A and the second electrodes 32 on the one principal surface 2a of the resin base material 2 and patterning the resist by a photolithography method. The outer circumferential portions of the first protective films 4A, 4B are covered with the second protective film 5.

As shown in FIG. 2, the second protective film 5 extends over the one principal surface 2a of the resin base material 2 and the first protective films 4A, 4B. The second protective film 5 covers another portion of the conductor pattern 3. The outer shape of the second protective film 5 is the same or substantially the same as the outer shape of the resin base material 2. The second protective film 5 includes two openings 5a, 5b so as not to block the first openings 4Aa, 4Ba and the second openings 4Ab, 4Bb of the first protective films 4A, 4B in planar view in the Z direction. In the first preferred embodiment, the opening 5a has a size circumscribing the three second openings 4Ab of the first protective film 4A. Similarly, the opening 5b has a size circumscribing the three second openings 4Bb of the first protective film 4B. Therefore, the conductor pattern 3 is covered with at least one of the protective films 4A, 4B and the second protective film 5 except for the first electrodes 31A, 31B and the second electrodes 32 exposed from the first openings 4Aa, 4Ba and the second openings 4Ab, 4Bb of the first protective films 4A, 4B.

The second protective film 5 has higher flexibility than the first protective films 4A, 4B. The second protective film 5 refer to any of protective films having a lower tensile strength than the first protective films 4A, 4B, protective films having a lower maximum load point than the first protective films 4A, 4B, and protective films having a small Young's modulus than the first protective films 4A, 4B. The second protective film 5 is preferably made of polyimide, for example. In the first preferred embodiment, the second protective film 5 is a coverlay film including an adhesive layer (not shown) extending over the one principal surface 2a of the resin base material 2 and the first protective films 4A, 4B. The thickness of the second protective film 5 is preferably about 20 µm, for example.

The first electrodes 31A, 31B and the second electrodes 32 exposed from the first openings 4Aa, 4Ba and the second openings 4Ab, 4Bb of the first protective films 4A, 4B are coated with plating 6 to prevent corrosion. The plating 6 is made of a material having higher oxidation resistance than the first electrodes 31A, 31B. The plating 6 is preferably made of a nickel-gold alloy, for example. The thickness of the plating 6 is preferably about 1 µm, for example.

For example, the plating 6 is formed by supplying a plating solution including a material having higher oxidation resistance than the first electrodes 31A, 31B through the first openings 4Aa, 4Ba and the second openings 4Ab, 4Bb of the first protective films 4A, 4B.

As shown in FIG. 2, a level difference is provided between the first protective films 4A, 4B and the one principal surface 2a of the resin base material 2. The level difference may causes, for example, a void of several tens of µm in regions E1, E2 adjacent to the outer circumferential end portions of the first protective films 4A, 4B and between the second protective film 5 and the one principal surface 2a of the resin base material 2. If the plating solution enters the regions E1, E2 and hardens, the conductor pattern in contact with the regions E1, E2 may be short-circuited. Therefore, in the first preferred embodiment, the conductor pattern 3 in contact with the regions E1, E2 is physically continuously designed to have the same potential. As a result, even when the conductor pattern in contact with the regions E1, E2 is short-circuited, electrical characteristics can be prevented from changing. In the first preferred embodiment, the regions E1, E2 are closed spaces so as not to be exposed to the outside. As a result, the plating solution can be prevented from entering the regions E1, E2.

In the flexible board 1 according to the first preferred embodiment, the first protective films 4A, 4B having lower flexibility than the resin base material 2 are arranged in the vicinity of the first electrodes 31A, 31B and the second electrodes (rigid regions in both end parts in the X direction) having a significant influence on patterning accuracy. The second protective film 5 having higher flexibility than the first protective films 4A, 4B is arranged in a portion (flexible region in an intermediate part in the X direction) having a significant influence on bending performance. As a result, the patterning accuracy can be improved, and a deterioration of the bending performance can be reduced or prevented. When the thickness of the second protective film 5 is thinner than that of the first protective films 4A, 4B, one or both of the advantageous effects of making the flexibility of the second protective film 5 higher and making the flexibility of the first protective films 4A, 4B lower are obtained. As a result, the patterning accuracy can be further improved, and the deterioration of the bending performance can be further reduced or prevented. Since the second protective film 5 extends over the one principal surface 2a of the resin base material 2 and the first protective films 4A, 4B, the conductor pattern 3 can be prevented from being unintentionally exposed from a gap between the first protective films 4A, 4B and the second protective film 5.

In the above description, the conductor pattern in contact with the regions E1, E2 is physically continuous. However, the present invention is not limited thereto. For example, conductor patterns in contact with the regions E1, E2 may be electrically connected to each other. Specifically, the conductor pattern in contact with the regions E1, E2 may be divided into multiple patterns, and these patterns may be electrically connected to each other. The conductor patterns in contact with the regions E1, E2 may be electrically connected through an external connecting structure, such as a jumper, for example. Even with this configuration, the electrical characteristics can be prevented from changing due to a short circuit. For example, the conductor pattern in contact with the regions E1, E2 may be divided into multiple patterns, and these patterns may be electrically connected to each other to have the same potential (e.g., define and function as a ground electrode) when connected to a circuit board.

In the above description, each of the first protective films 4A, 4B includes the three second openings 4Ab, 4Bb, and the three second electrodes 32 are exposed. However, the present invention is not limited thereto. For example, each of the first protective films 4A, 4B may include one second opening 4Ab, 4Bb such that one second electrode 32 is exposed. Alternatively, for example, each of the first protective films 4A, 4B may include four second openings 4Ab, 4Bb such that four second electrodes 32 are exposed.

Figure 4:
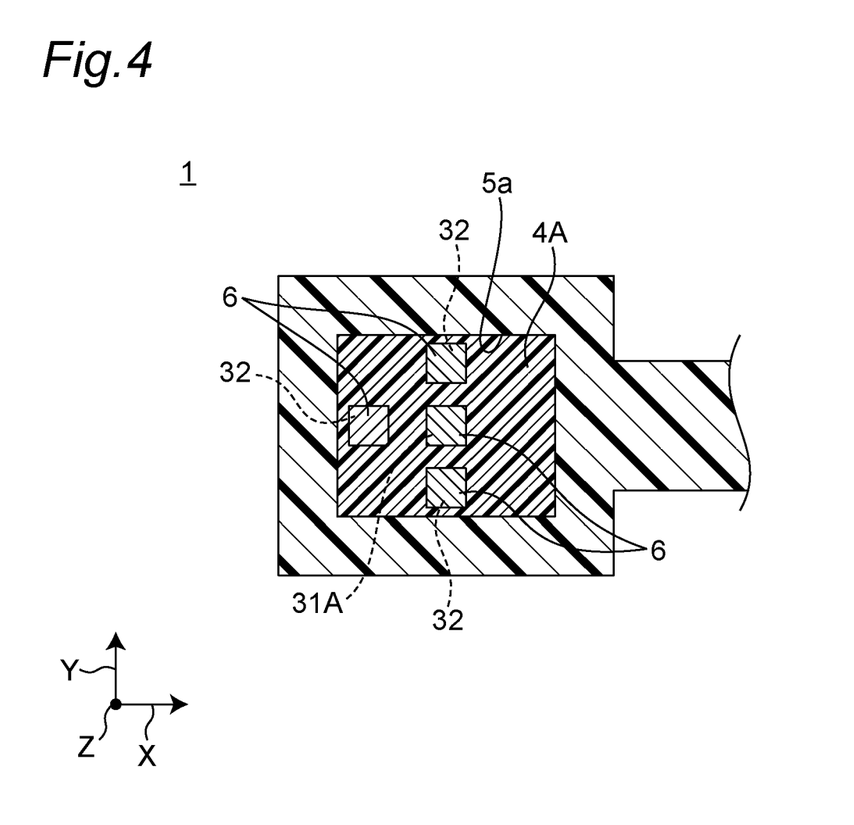
FIG. 4 is an enlarged plan view showing a modification of an opening disposed in the second protective film in the flexible board of FIG. 1.

In the above description, the opening 5a has a size circumscribing the three second openings 4Ab of the first protective film 4A. However, the present invention is not limited thereto. For example, as shown in FIG. 4, the opening 5a may have a size enclosing the first opening 4Aa and the second openings 4Ab of the first protective film 4A in planar view in the Z direction. According to this configuration, the first electrode 31A and the second electrodes 32 are exposed depending only on the first opening 4Aa and the second openings 4Ab of the first protective film 4A, so that the patterning accuracy can be further improved.

In the above description, the opening 5b has a size circumscribing the three second openings 4Bb of the first protective film 4B. However, the present invention is not limited thereto. For example, the opening 5b may have a size enclosing the first opening 4Ba and the second openings 4Bb of the first protective film 4B in planar view in the Z direction. According to this configuration, the first electrode 31B and the second electrodes 32 are exposed depending only on the first opening 4Ba and the second openings 4Bb of the first protective film 4B, so that the patterning accuracy can further be improved.

The flexible board 1 may be bent in a portion provided with the second protective film 5. Specifically, the flexible board 1 may be bent in the portion provided with the second protective film 5 or may be bent into an S-shaped curve, for example. According to this configuration, since the second protective film 5 has higher flexibility than the first protective films 4A, 4B, the second protective film 5 can follow the bending, and the deterioration of the bending performance can be reduced or prevented.

Figure 5:
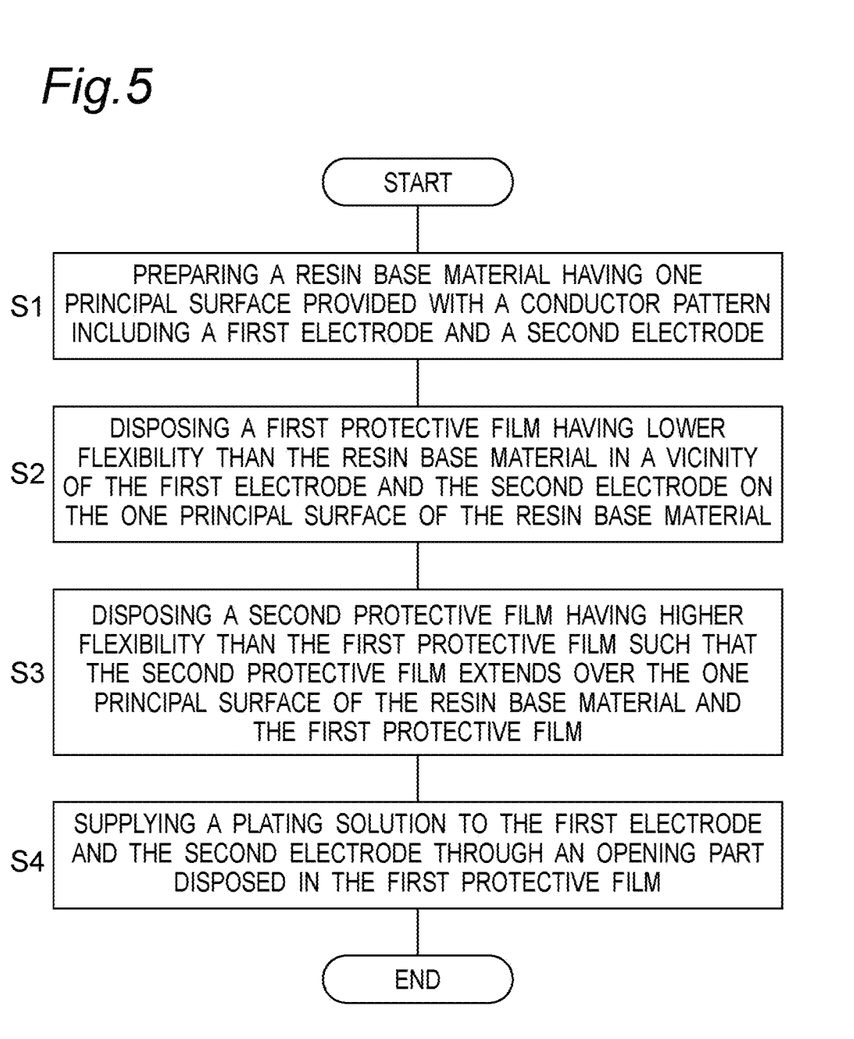
FIG. 5 is a flowchart showing a method for manufacturing the flexible board of FIG. 1.

A non-limiting example of a method for manufacturing the flexible board 1 will be described. FIG. 5 is a flowchart showing a non-limiting example of a method for manufacturing the flexible board 1.

First, the flexible resin base material 2 is prepared that is provided with the conductor pattern 3 including the first electrodes 31A, 31B and the second electrodes 32 electrically separated from each other on the one principal surface 2a (step S1).

Subsequently, the first protective films 4A, 4B having lower flexibility than the resin base material 2 are disposed on the one principal surface of the resin base material 2 in the vicinity of the first electrodes 31A, 31B and the second electrodes 32 and is formed to cover a portion of the conductor pattern 3 (step S2). At this step, the first protective films 4A, 4B are formed by applying a resist in the vicinity of the first electrode 31A and the second electrodes 32 on the one principal surface 2a of the resin base material 2 and patterning the resist by a photolithography method. According to this method, the patterning accuracy can be further improved.

Subsequently, the second protective film 5 having higher flexibility than the first protective films 4A, 4B is disposed such that the second protective film 5 extends over the one principal surface 2a of the resin base material 2 and the first protective films 4A, 4B to cover the other portion of the conductor pattern 3 (step S3). At this step, the second protective film 5 is a coverlay film including an adhesive layer bonded to extend over the one principal surface 2a of the resin base material 2 and the first protective films 4A, 4B. As a result, the deterioration of the bending performance can be further reduced or prevented.

Subsequently, a plating solution including a material having higher oxidation resistance than the first electrodes 31A, 31B is supplied through the first openings 4Aa, 4Ba and the second openings 4Ab, 4Bb of the first protective films 4A, 4B to at least portions of the first electrodes 31A, 31B and the second electrode 32 (step S4). The flexible board 1 according to the first preferred embodiment is designed to have the physically continuous conductor pattern in contact with the regions E1, E2. Therefore, even when the plating solution enters the regions E1, E2 and hardens to cause a short circuit of the conductor pattern, the electrical characteristics can be prevented from changing.

Figure 6:
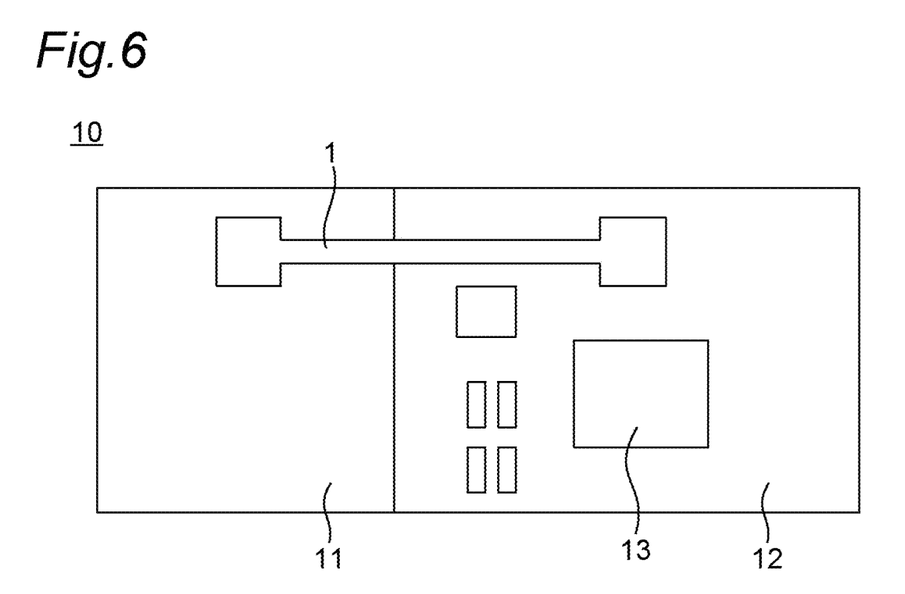
FIG. 6 is a plan view showing a schematic configuration of an electronic device according to a preferred embodiment of the present invention including the flexible board of FIG. 1.
Figure 7:
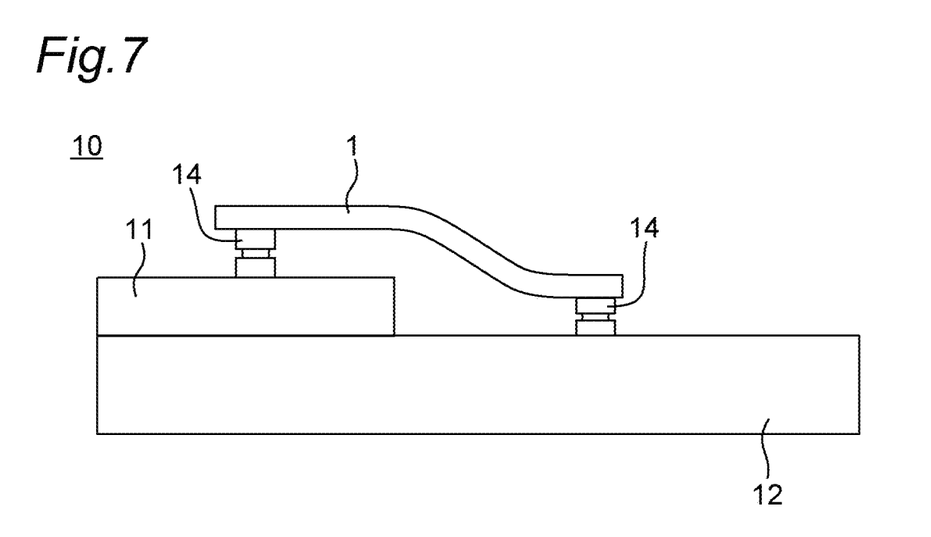
FIG. 7 is a side view of the electronic device of FIG. 6.

An electronic device 10 according to the first preferred embodiment of the present invention including the flexible board 1 will be described. FIG. 6 is a plan view showing a schematic configuration of the electronic device 10 including the flexible board 1. FIG. 7 is a side view of the electronic device of FIG. 6.

The electronic device 10 includes at least one circuit board 11, 12 and the flexible board 1 connected to the circuit boards 11, 12. In the first preferred embodiment, the electronic device 10 includes the two circuit boards 11, 12 including high frequency circuits. One or more electronic components 13 are mounted on the circuit board 12.

The flexible board 1 is connected to the circuit boards 11, 12 via connectors 14 in a state of being bent in the portion provided with the second protective film 5. In the first preferred embodiment, the first electrodes 31A, 31B and the second electrodes 32 of the flexible board 1 are connected to the connectors 14 by solder, for example. When the flexible board 1 is connected to the circuit boards 11, 12, the conductor pattern in contact with the regions E1, E2 shown in FIG. 2 has the same potential. In the first preferred embodiment, the conductor pattern in contact with the regions E1, E2 defines and functions as a ground electrode.

Second Preferred Embodiment

Figure 8:
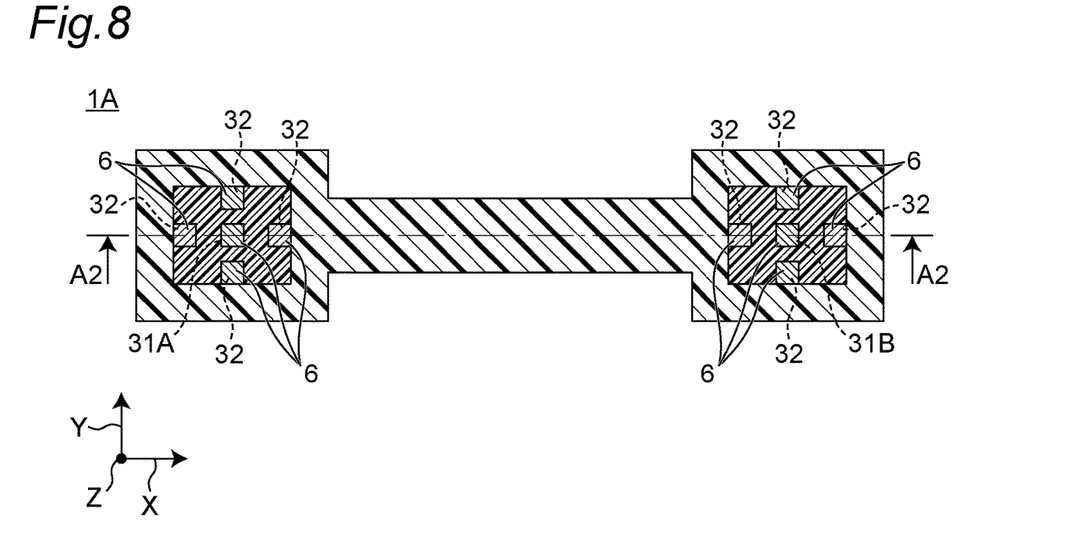
FIG. 8 is a plan view showing a schematic configuration of a flexible board according to a second preferred embodiment of the present invention.
Figure 9:
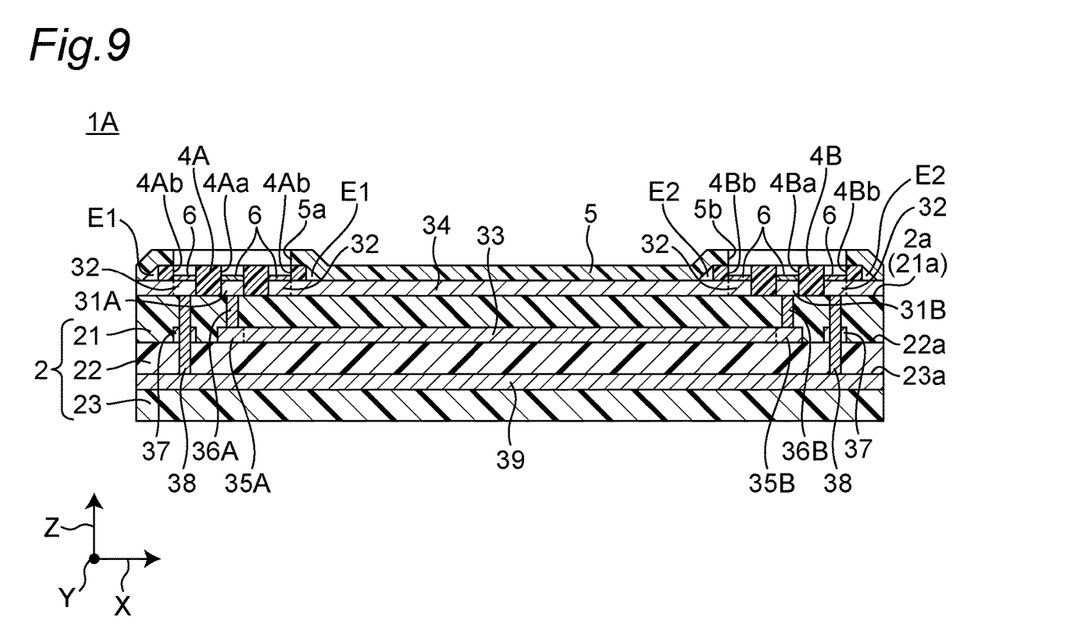
FIG. 9 is a cross-sectional view taken along a line A2-A2 of FIG. 8.

FIG. 8 is a plan view showing a schematic configuration of a flexible board according to a second preferred embodiment of the present invention. FIG. 9 is a cross-sectional view taken along a line A2-A2 of FIG. 8. FIGS. 10A to 10E are exploded plan views of the flexible board of FIG. 8.

A main difference of a flexible board 1A according to the second preferred embodiment from the flexible board 1 according to the first preferred embodiment is that the resin base material 2 has a three-layer structure and conductor patterns are divided and disposed on layers.

More specifically, as shown in FIG. 9, the resin base material 2 includes a first resin base material layer 21, a second resin base material layer 22, and a third resin base material layer 23. The first resin base material layer 21, the second resin base material layer 22, and the third resin base material layer 23 are laminated in the Z direction.

Figure 10A:
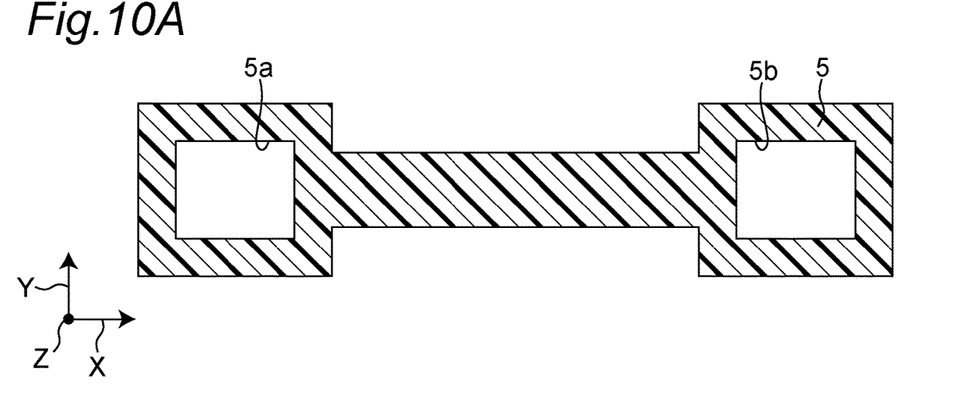
FIG. 10A is an exploded plan view of the flexible board of FIG. 8, showing a second protective film.
Figure 10B:
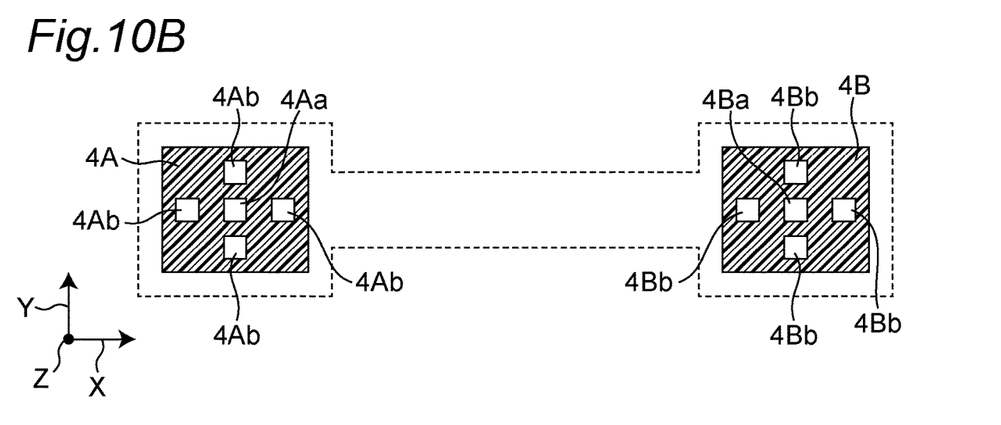
FIG. 10B is an exploded plan view of the flexible board of FIG. 8, showing first protective films.
Figure 10C:
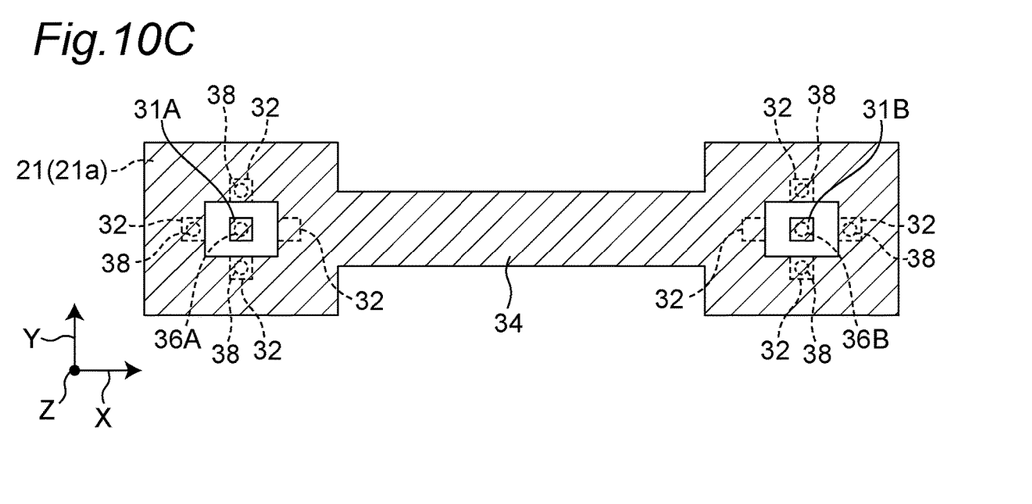
FIG. 10C is an exploded plan view of the flexible board of FIG. 8, showing a first resin base material layer provided with a conductor pattern on one principal surface.

As shown in FIG. 10C, the first electrodes 31A, 31B and the ground conductor 34 are disposed on one principal surface 21a of the first resin base material layer 21 as conductor patterns. In the second preferred embodiment, the signal line 33 is not disposed on the first resin base material layer 21, and the ground conductor 34 surrounds the first electrodes 31A, 31B at an interval. Therefore, the ground conductor 34 has a solid shape on the entire or substantially the entire first resin base material layer 21 except near the first electrodes 31A, 31B. In the second preferred embodiment, four second electrodes 32 are disposed as portions of the ground conductor 34.

Figure 10D:
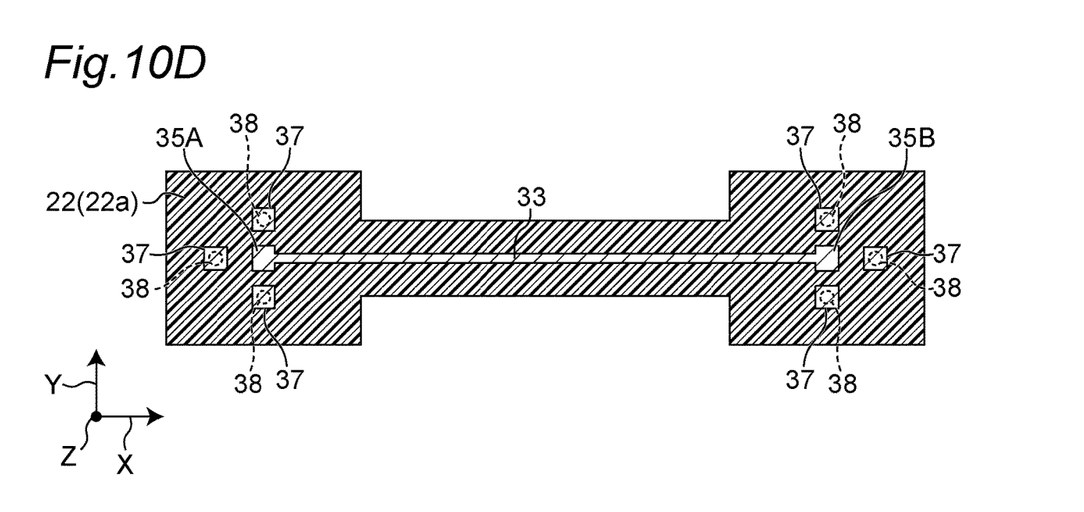
FIG. 10D is an exploded plan view of the flexible board of FIG. 8, showing a second resin base material layer provided with a conductor pattern on one principal surface.

As shown in FIG. 10D, connecting conductors 35A, 35B, the signal line 33, and ground conductors 37 are provided as conductor patterns on the one principal surface 22a of the second resin base material layer 22.

The connecting conductor 35A is disposed on one end portion side of the second resin base material layer 22 in the X direction. As shown in FIG. 9, the connecting conductor 35A is connected to the first electrode 31A via an interlayer connecting conductor 36A, such as a via hole conductor, for example.

The connecting conductor 35B is disposed on the other end portion side of the second resin base material layer 22 in the X direction. As shown in FIG. 9, the connecting conductor 35B is connected to the first electrode 31B via an interlayer connecting conductor 36B, such as a via hole conductor, for example.

The connecting conductor 35A and the connecting conductor 35B are connected by the signal line 33. In the second preferred embodiment, the signal line 33 is a linear conductor extending in the X direction and connects the center of the connecting conductor 35A in the Y direction and the center of the connecting conductor 35B in the Y direction.

The three ground conductors 37 are arranged around each of the connecting conductor 35A and the connecting conductor 35B. An interlayer connecting conductor 38, such as a via hole conductor, for example, penetrates through each of the ground conductors 37. The interlayer connecting conductors 36A, 36B, 38 are formed by, for example, filling holes in the resin base material 2 by laser irradiation etc., for example, with a conductive paste including copper and tin and curing the paste.

Figure 10E:
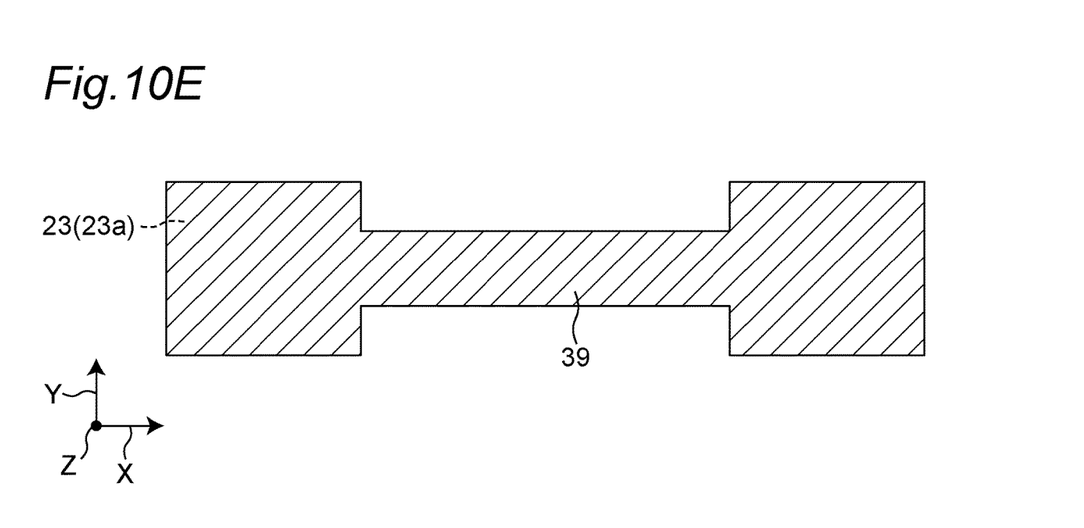
FIG. 10E is an exploded plan view of the flexible board of FIG. 8, showing a third resin base material layer provided with a conductor pattern on one principal surface.

As shown in FIG. 10E, a ground conductor 39 is provided as a conductor pattern on one principal surface 23a of the third resin base material layer 23. In the second preferred embodiment, the ground conductor 39 has a solid shape on the entire or substantially the entire one principal surface 23a of the third resin base material layer 23. The ground conductor 39 is connected to the second electrodes 32, i.e., the ground conductor 34, via the interlayer connecting conductors 38 and the ground conductors 37.

As shown in FIG. 9, the first protective films 4A, 4B are disposed in the vicinity of the first electrodes 31A, 31B and the four second electrodes 32. The first protective film 4A includes four second openings 4Ab disposed around the first opening 4Aa at intervals. The second electrode 32 is exposed from each of these four second openings 4Ab. The first protective film 4B includes four second openings 4Bb disposed around the first opening 4Ba at intervals. The second electrode 32 is exposed from each of these four second openings 4Bb. The first electrodes 31A, 31B and the second electrodes 32 are coated with the plating 6.

The opening 5a in the second protective film 5 has a size completely enclosing the first opening 4Aa and the four second openings 4Ab of the first protective film 4A. Similarly, the opening 5b in the second protective film 5 has a size completely enclosing the first opening 4Ba and the four second openings 4Bb of the first protective film 4B.

As shown in FIG. 9, a level difference is provided between the first protective films 4A, 4B and the one principal surface 21a of the first resin base material layer 21. The level difference may causes, for example, a void of several tens of µm in regions E1, E2 adjacent to the outer circumferential end portions of the first protective films 4A, 4B and between the second protective film 5 and the one principal surface 21a of the first resin base material 21. If the plating solution enters the regions E1, E2 and hardens, the conductor pattern in contact with the regions E1, E2 may be short-circuited. Therefore, in the second preferred embodiment, the conductor pattern in contact with the regions E1, E2 is the ground conductor 34 and is designed to be physically continuous. As a result, even when the ground conductor 34 in contact with the regions E1, E2 is short-circuited, electrical characteristics can be prevented from changing. In the second preferred embodiment, the regions E1, E2 are closed spaces so as not to be exposed to the outside. As a result, the plating solution can be prevented from entering the regions E1, E2.

In the flexible board 1A according to the second preferred embodiment, the first protective films 4A, 4B having lower flexibility than the resin base material 2 are arranged in the vicinity of the first electrodes 31A, 31B and the second electrodes (rigid regions in both end parts in the X direction) having a significant influence on patterning accuracy. The second protective film 5 having higher flexibility than the first protective films 4A, 4B is arranged in a portion (flexible region in an intermediate part in the X direction) having a significant influence on bending performance. As a result, the patterning accuracy can be improved, and a deterioration of the bending performance can be reduced or prevented. Since the second protective film 5 extends over the one principal surface 21a of the first resin base material 21 and the first protective films 4A, 4B, the conductor pattern 3 can be prevented from being unintentionally exposed from a gap between the first protective films 4A, 4B and the second protective film 5.

It is to be noted that any of the various preferred embodiments described above can appropriately be combined to produce the advantageous effects of the respective preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible board comprising:
   a resin base material having flexibility;
   a conductor pattern on one principal surface of the resin base material and including a first electrode and a second electrode electrically separated from each other;
   a first protective film having lower flexibility than the resin base material and covering a portion of the conductor pattern; and
   a second protective film having higher flexibility than the first protective film and extending over the one principal surface of the resin base material and the first protective film to cover another portion of the conductor pattern; wherein
   the first protective film and the second protective film are stacked on the resin base material;
   the first protective film is closer to the first electrode and the second electrode on the one principal surface of the resin base material than the second protective film; and
   the first protective film includes a first opening exposing at least a portion of the first electrode and a second opening exposing at least a portion of the second electrode in planar view.

2. The flexible board according to claim 1, wherein a thickness of the second protective film is thinner than a thickness of the first protective film.

3. The flexible board according to claim 1, wherein portions of the conductor pattern in contact with a region adjacent to an outer circumferential end portion of the first protective film and between the second protective film and the one principal surface of the resin base material are electrically connected to each other.

4. The flexible board according to claim 3, wherein the portions of the conductor pattern in contact with the region are physically continuous.

5. The flexible board according to claim 1, wherein a region adjacent to an outer circumferential end portion of the first protective film and between the second protective film and the one principal surface of the resin base material is a closed space so as not to be exposed to outside.

6. The flexible board according to claim 1, wherein the flexible board is bent in a portion provided with the second protective film.

7. The flexible board according to claim 1, wherein the first electrode is coated with a material having higher oxidation resistance than the first electrode.

8. The flexible board according to claim 1, wherein the second protective film includes an opening enclosing the first opening and the second opening of the first protective film in planar view.

9. An electronic device comprising:
at least one circuit board; and
a flexible board connected to the circuit board; wherein the flexible board includes:
   a resin base material having flexibility;
   a conductor pattern on one principal surface of the resin base material and including a first electrode and a second electrode electrically separated from each other;
   a first protective film having lower flexibility than the resin base material and covering a portion of the conductor pattern; and
   a second protective film having higher flexibility than the first protective film and extending over the one principal surface of the resin base material and the first protective film to cover another portion of the conductor pattern;
   the first protective film and the second protective film are stacked on the resin base material;
   the first protective film is closer to the first electrode and the second electrode on the one principal surface of the resin base material than the second protective film; and
   the first protective film includes a first opening exposing at least a portion of the first electrode and a second opening exposing at least a portion of the second electrode in planar view.

10. The electronic device according to claim 9, wherein a thickness of the second protective film is thinner than a thickness of the first protective film.

11. The electronic device according to claim 9, wherein portions of the conductor pattern in contact with a region adjacent to an outer circumferential end portion of the first protective film and between the second protective film and the one principal surface of the resin base material have a same potential when connected to the circuit board.

12. The electronic device according to claim 11, wherein the portions of the conductor pattern in contact with the region define and function as a ground electrode.

13. The electronic device according to claim 9, wherein the flexible board is connected to the circuit board in a state of being bent in a portion provided with the second protective film.

* * * * *